US006707064B2

United States Patent
Jang et al.

(10) Patent No.: US 6,707,064 B2
(45) Date of Patent: Mar. 16, 2004

(54) TEST ELEMENT GROUP STRUCTURE

(75) Inventors: Byung-Tak Jang, Kyunggi-do (KR); Kyung-Ho Kim, Kyunggi-do (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/238,872

(22) Filed: Sep. 11, 2002

(65) Prior Publication Data

US 2003/0062521 A1 Apr. 3, 2003

(30) Foreign Application Priority Data

Sep. 11, 2001 (KR) ......................... 2001-55950

(51) Int. Cl.[7] .............................................. H01L 23/58
(52) U.S. Cl. ........................... 257/48; 257/62; 324/765; 324/769
(58) Field of Search .................... 257/48, 620; 324/765, 324/769

(56) References Cited

U.S. PATENT DOCUMENTS 5,654,582 A      8/1997   Kijima et al.
5,949,090 A      9/1999   Iwasa et al.
5,952,838 A   *  9/1999   Tikhonov .................... 324/754
6,177,733 B1     1/2001   Obara
6,529,031 B2  *  3/2003   Gerstmeier et al. ......... 324/769

* cited by examiner

*Primary Examiner*—Jerome Jackson
(74) *Attorney, Agent, or Firm*—Harness, Dickey & Pierce, P.L.C.

(57) ABSTRACT

A semiconductor wafer includes a plurality of chip areas having circuit elements, a scribe line area for defining the chip areas, and a plurality of test element group (TEG) modules. The TEG modules are group formed on the scribe line area. Each of the TEG modules has test transistors, a common source pad, and a common body pad. A global gate pad is commonly connected to gates of test transistors in the test element group modules. Global drain pads are shared by respective test transistors in the TEG modules. In other words, each drain pad is commonly connected to corresponding drains of test transistor in at least two TEG modules such that a drain pad is shared by plural TEG modules, considerably reducing an area occupied by each TEG module.

16 Claims, 6 Drawing Sheets

TEST ELEMENT GROUP STRUCTURE

FIELD OF THE INVENTION

The present invention relates to a semiconductor integrated circuit fabricating technology and, more particularly, to a semiconductor device formed on a semiconductor wafer having a scribe line area between chip areas.

BACKGROUND OF THE INVENTION

Generally, a plurality of integrated circuit chips are formed on a semiconductor substrate (wafer) by performing semiconductor thin film processes having peculiar properties. Following formation of the integrated circuit chips, the wafer is sawed for individualizing them. Thus, a vacant space exists between integrated circuit chips. Namely, a vacant space for sawing the wafer is formed between the integrated circuit chips. The vacant space is called a scribe line area. Elements constituting an integrated circuit chip are not formed at the scribe line area.

To assess electric properties of elements constituting an integrated circuit chip, a predetermined pattern of measuring elements or test elements (so-called test element group (TEG)) is formed on a scribe line area of a semiconductor wafer. The TEG is electrically tested for determining whether elements are suitably formed in integrated circuit chips formed on the wafer. A semiconductor device including measuring elements or test elements used for testing electric properties is disclosed in U.S. Pat. No. 6,177,733 entitled "SEMICONDUCTOR DEVICE", U.S. Pat. No. 5,949,090 entitled "MOS TEG STRUCTURE", and U.S. Pat. No. 5,654,582 entitled "CIRCUIT WAFER AND TEG AND ELECTRODE".

Since the TEG is formed using the same process as a process for forming elements in integrated circuit chips, testing electric properties of the TEG is identical to testing electric properties of the elements formed in the integrated circuit chips. Accordingly, the properties of the integrated circuit chips can be correctly deduced by testing the TEG. Once the properties have been tested, there remains no reason to retain the TEG. So the TEG can be formed in a sacrificial area of the wafer. Hence, the TEG is disposed in a scribe line area of the wafer to prevent a decrease in the number of integrated circuit chips that otherwise could be produced from the wafer.

As shown in FIG. 1, a scribe line area 2 surrounds an integrated circuit chip area 3 where input pads, output pads, and MOS elements (not shown) are formed. A test element group (TEG) is disposed on the scribe line area. The TEG includes TEG modules each having a plurality of MOS elements.

The elements constituting the respective TEG modules are classified into, for example, a P-channel transistor for logic gate, an N-channel transistor for logic gate, a field N-channel transistor, a field P-channel transistor, a capacitor for logic gate, a contact chain, and a resistor. N-channel transistors for logic gate are disposed at one TEG module, while P-channel transistors for logic gate are disposed at another TEG module.

Referring to FIG. 2, each of TEG modules $10a$, $10b$, ..., and $10c$ includes test elements (TE_$0a$)–(TE_na), (TE_$0b$)–(TE_nb), ... and (TE_$0c$)–(TE_nc) each being formed in a corresponding P-well area (or N-well area). For brevity of the description, one of TEG modules (e.g., $10a$) is described. It will be understood to a person skilled in the art that the other TEG modules are disposed by the same manner.

Each of the test elements (TE_$0a$)–(TE_na) constituting the TEG module $10a$ is a MOS transistor having, for example, a source, a drain, a gate, and a body. A common source line $12a$, a common gate line $14a$, and a common body line $16a$ are extended on a well area of the TEG module in the same direction. Sources of the test elements are commonly connected to a common source pad area $18a$ through the common source line $12a$. Gates of the test elements are commonly connected to a common gate pad $20a$ through the common gate line $14a$. Bodies of the test elements are commonly connected to a common body pad $22a$ through the common body line $16a$. The common source pad $18a$, the common gate pad $20a$, and the common body pad $22a$ are disposed at one side (e.g., right area) of an area of the TEG module $10a$. Since the common body pad $22a$ formed in the TEG module $10a$ is electrically connected to the other modules $10b$–$10c$ through a P-well, different voltages cannot be applied to the modules $10a$–$10c$. The common body pad $22a$ just has a structure to offer a measuring convenience.

Drains of the test elements (TE_$0a$)–(TE_na) formed in the TEG module $10a$ are coupled to corresponding drain pads (24_$0a$)–(24$_{13}$ na), respectively. The drain pads (24_$0a$)–(24_na) are disposed to be adjacent to corresponding test elements (TE$_{13}$ $0a$)–(TE_na). Unlike a common gate and source pads, drain pads are separately formed for measuring a drain current of the test elements (TE_$0a$)–(TE_na) without an affect of the other test elements. That is, each of the test elements requires an independent drain pad (namely, a 1:1 ratio) so as to measure electric properties of the test elements formed in the TEG module $10a$. If a drain pad is commonly used, a leakage current may flow through unselected test elements irrespective of any selected test element.

A trend in the area of integrated circuit design has been to reduce element size, recently from 0.19 micrometer to 0.10 micrometer or less. Similarly, there is a trend towards decreasing the width of a scribe line area, not a chip area. In view of the trends, the number of drain pads formed in respective TEG modules becomes a significant factor limiting the number of test elements available for use in the TEG module. This will now be explained in further detail below.

Referring to FIG. 3, there is illustrated a relationship between sizes of a drain pad and a test element. A size of a drain pad 24_$0a$ is about 100×100 micrometers, while that of a test element TE_$0a$ is about 1×10 micrometers. As compared to an area occupied by the test element TE_$0a$, an area occupied by the drain pad 24$_{13}$ $0a$ is considerably larger. Therefore, as a width of a scribe line area becomes smaller, the number of test elements is limited due to the area occupied by the drain pads.

SUMMARY OF THE INVENTION

The above problem associated with the Background Art is addressed by the present invention as will be understood by reading and studying the following specification. An embodiment of the invention is directed to a test element group structure that lessens an extent to which the number of test transistors decreases in proportion to a reduction in scribe line area.

According to an aspect of the invention, a semiconductor wafer comprises a plurality of chip areas having circuit elements, a scribe line area for defining the chip areas, a test element group that is formed on the scribe line area and includes a plurality of test element group modules. Each of the test element group modules (TEG) has a source, a drain, a gate, and a body. Each of the TEG modules includes test transistors formed in substantially the same manner as the circuit elements, a first pad commonly connected to sources of the test transistors, and a second pad commonly connected to bodies of the test transistors. A third pad is commonly connected to gates of test transistors in the TEG modules. A plurality of fourth pads are connected to drains of respective test transistors of one TEG module, and are shared by respective test transistors of the other TEG modules. When corresponding test voltages are respectively applied to the first to fourth pads coupled to a test transistor in one selected from the TEG modules, substantially the same test voltage applied to the fourth pad is substantially simultaneously also applied to first and second pads of each of unselected TEG modules.

According to another aspect of the invention, a test element group is provided which is disposed in a scribe line area defined by chip areas formed on a semiconductor wafer. The test element group includes at least two test element group (TEG) modules each being formed in a pocket well region. Each of the TEG modules includes test transistors each having a source, a drain, a gate, and a body and being formed in substantially the same manner as the chip areas, a common source pad commonly connected to sources of the test transistors, and a common body pad commonly connected to bodies of the test transistors. Further, the test element group includes a global gate pad and a plurality of global drain pads. The global gate pad can be disposed in one of the TEG modules and is commonly connected to gates of the test transistors in the TEG modules. The global drain pads can be disposed in a first TEG module and are connected to drains of respective test transistors in the first TEG respectively. Also the global drain pads are shared by respective test transistors in a second TEG module.

In this embodiment, when corresponding test voltages are respectively applied to the common source pad, the common body pad, the global gate pad, and one of the global drain pads that are connected to the test transistor in the first TEG module, substantially the same test voltage applied to the common source pad and the global drain pad in the second TEG module is substantially simultaneously also applied to a common source pad and a common body pad in the second TEG module.

According to yet another aspect of the invention, a test element group is provided which is supplied to a scribe line area so as to measure electric properties of circuit elements integrated in a chip area. The test element group comprises first to third test element group (TEG) modules each being disposed in respective pocket P-well regions. The first TEG module includes first test transistors formed in substantially the same manner as transistors in the chip area; a first common source pad commonly connected to sources of the first test transistors; a first common body pad commonly connected to bodies of the first test transistors; a global gate pad that is disposed in the first TEG module and is commonly connected to gates of the first test transistors; and a plurality of global drain pads that are disposed in the first TEG module and are connected to drains of the first test transistors respectively. The second TEG module includes second test transistors each having a source, a drain, a gate, and a body and being formed in substantially the same manner as the chip areas; a second common source pad commonly connected to sources of the second transistors; and a second common body pad commonly connected to bodies of the second transistors. The second test transistors correspond to the first test transistors, respectively. Drains of the second test transistors are electrically connected to corresponding global drain pads respectively and are commonly connected to the global gate pad. The third TEG module includes third test transistors each having a source, a drain, a gate, and a body and being formed in substantially the same manner as the chip areas; a third common source pad commonly connected to sources of the third test transistors; and a third common body pad commonly connected to bodies of the third test transistors. The third test transistors correspond to the first test transistors, respectively. Drains of the third transistors are electrically connected to corresponding global drain pads respectively and are commonly connected to the global gate pad.

Advantageously, such a structure makes it possible to reduce an area occupied by drain pads of a test element group.

BRIEF DESCRIPTION OF THE DRAWINGS

The foregoing features of the invention will be more readily understood by reference to the following detailed description taken with the accompanying drawings.

DESCRIPTION OF THE PREFERRED EMBODIMENT

Figure 1:
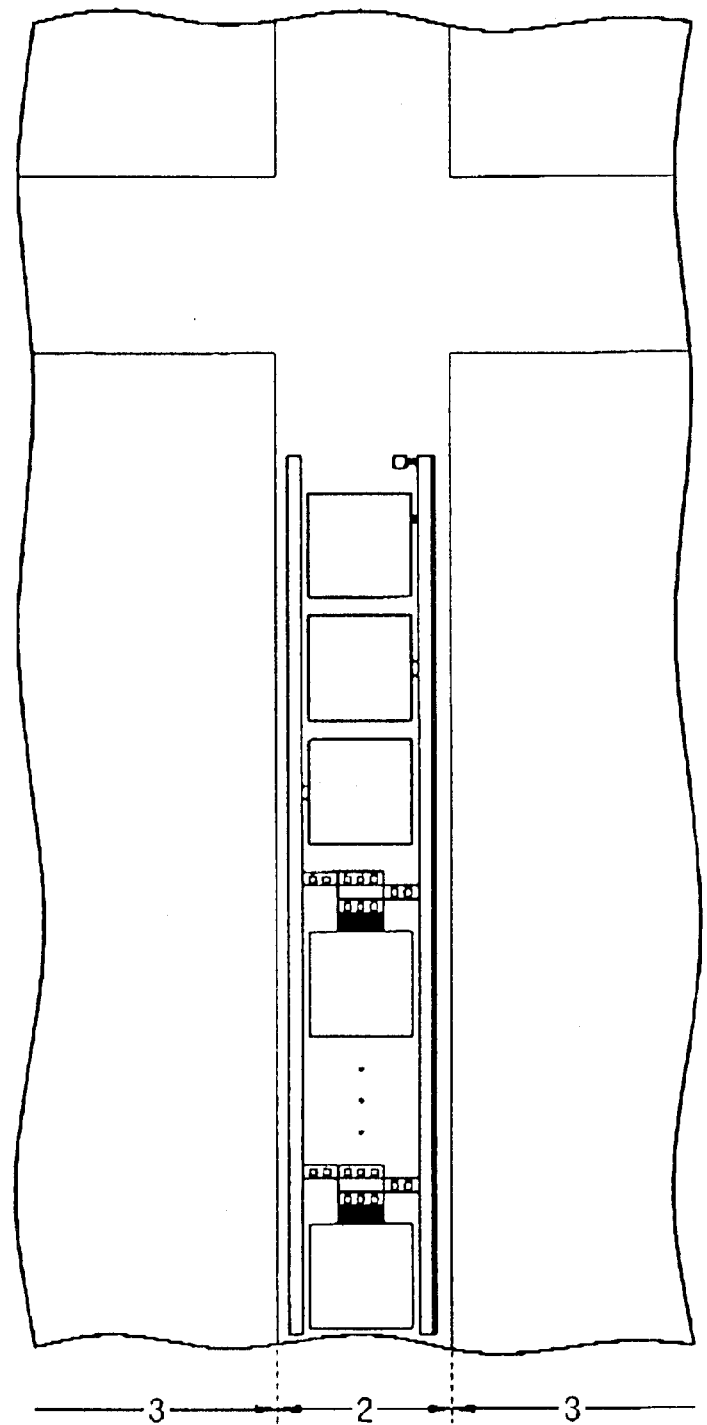
FIG. 1 shows a part of a wafer according to the Background Art having a test element group formed on a scribe line area.
Figure 2:
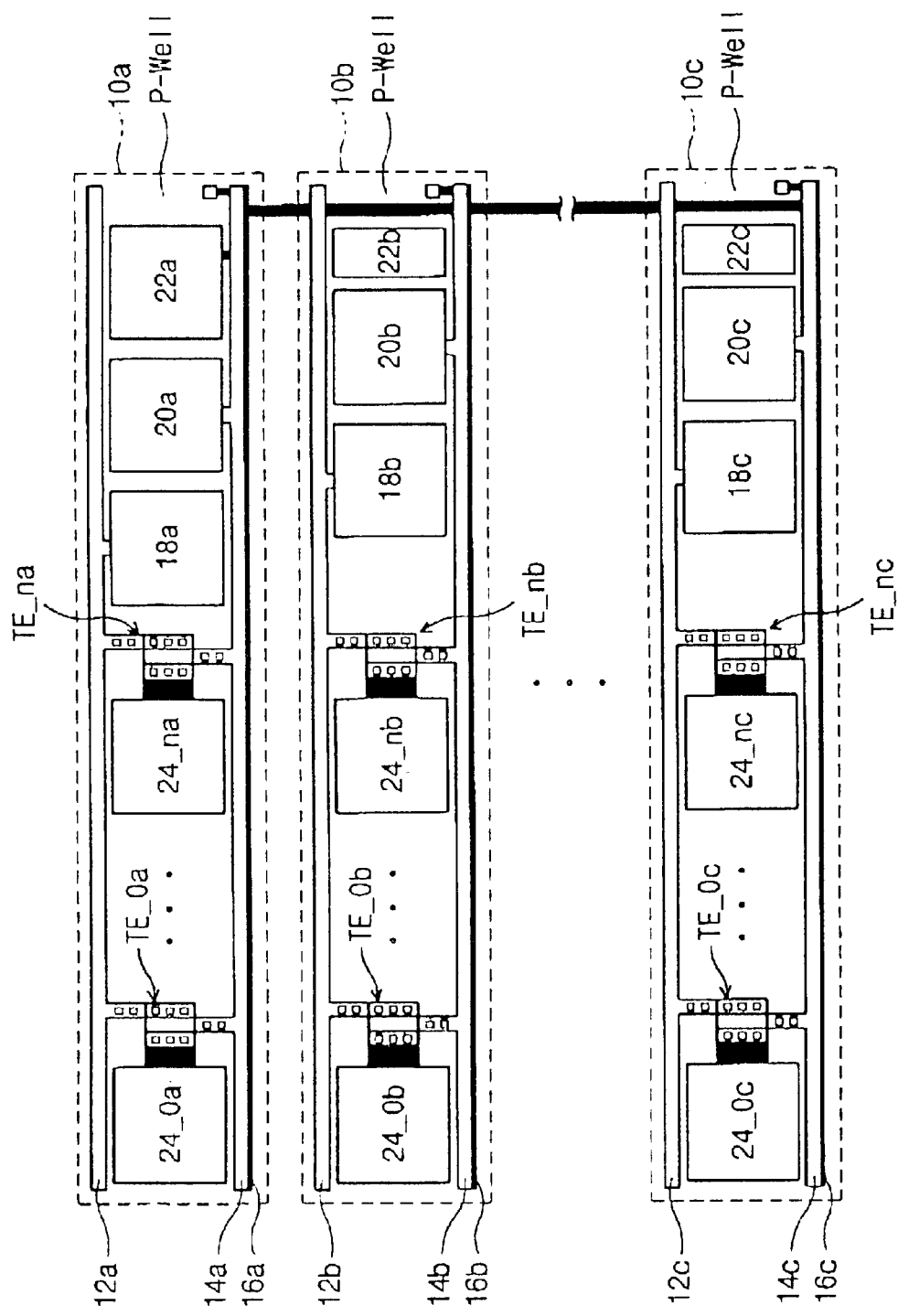
FIG. 2 is a top plan view of a layout structure of a test element group according to Background Art.
Figure 3:
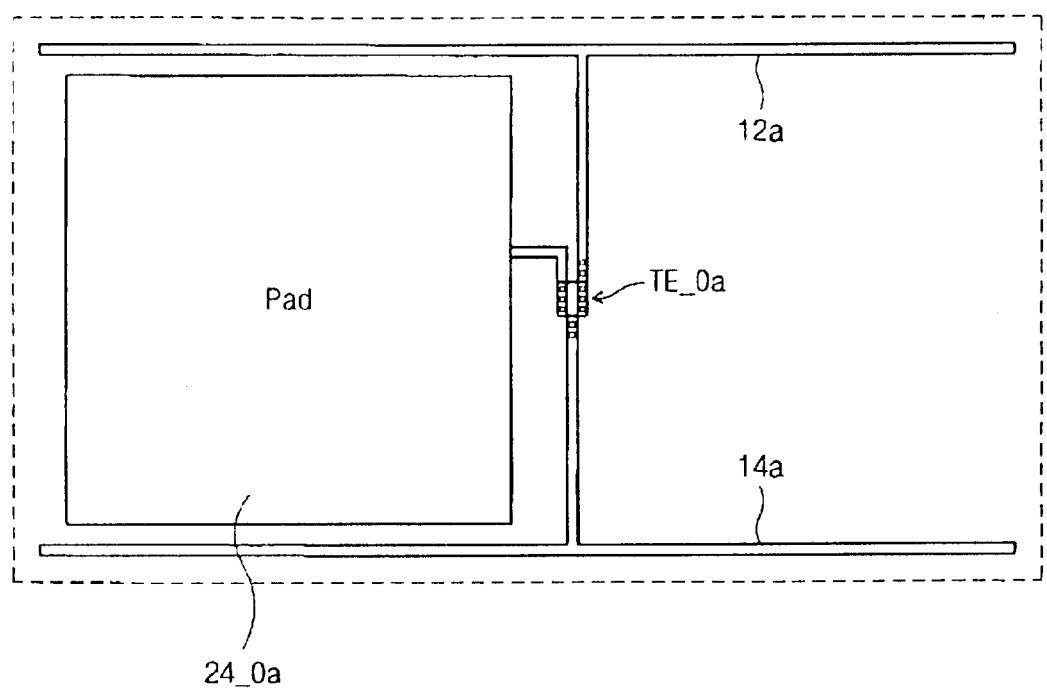
FIG. 3 is for explaining a relative size of a test element of a drain pad shown in FIG. 2.

Reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

Figure 4:
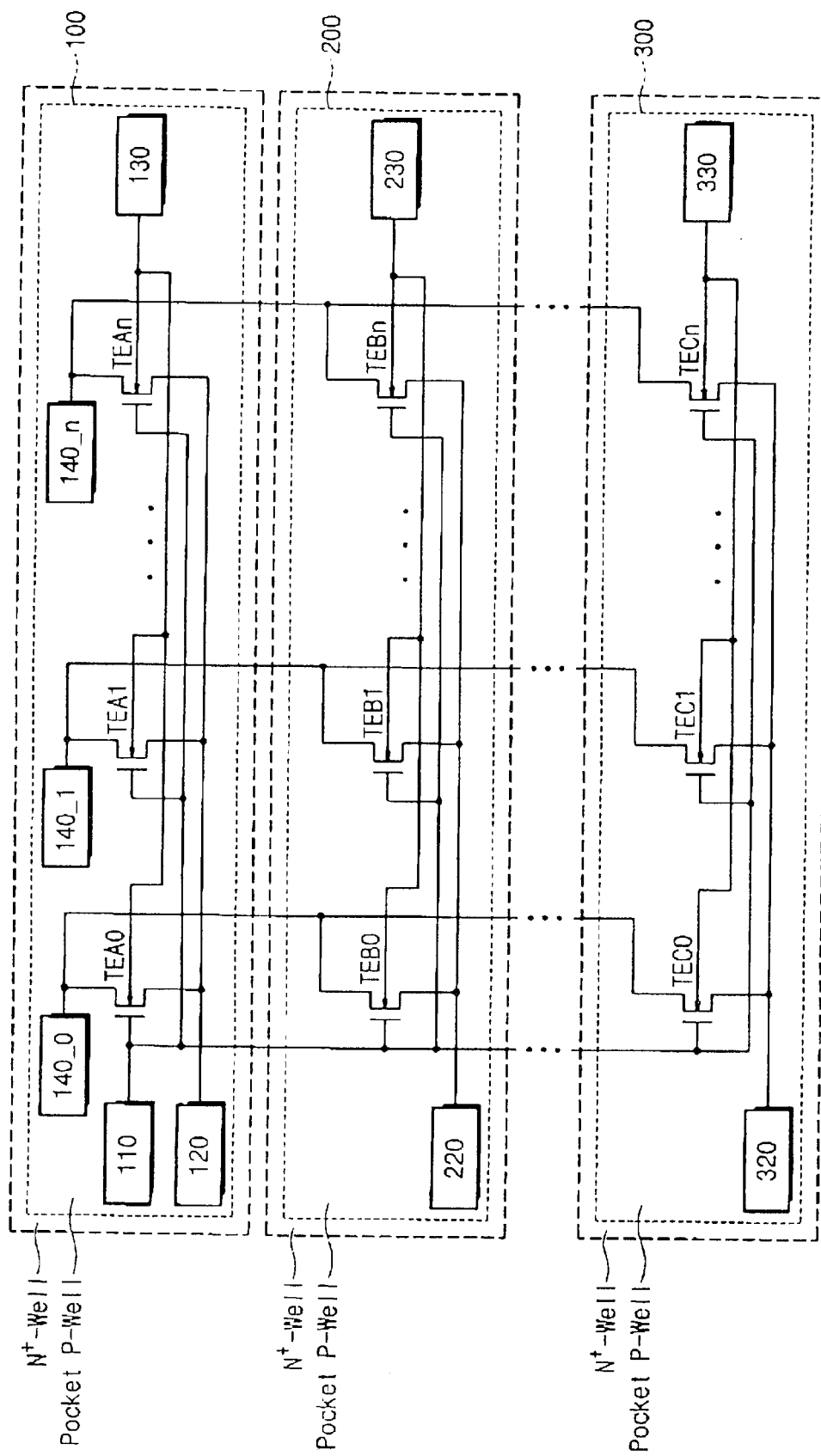
FIG. 4 is a circuit diagram of an equivalent circuit of a test element group according to the present invention.

Referring to FIG. 4, a test element group (TEG) according to the invention includes TEG modules 100, 200, . . . , and 300 each having a plurality of test elements or measuring elements.

For example, the TEG module 100 has a plurality of test elements TEA0–TEAn (n being an integer of 1 or larger), a global gate pad 110, a common source pad 120, a common body pad 130, and global drain pads (140__0)–(140__n) each corresponding to their test elements TE0–TEn. The test elements TE0–TEn are formed in a pocket P-well region that is formed in an $N^+$-well region, and includes an NMOS transistor (or referred to as "test or measuring transistor") having a source, a drain, a gate, and a body. Gates of the test transistors TEA0–TEAn of the TEG module 100 are commonly coupled to the global gate pad 110, as shown in FIG. 4. Sources of the test transistors TEA0–TEAn are commonly coupled to the common source pad 120. Bodies of the test transistors TEA0–TEAn are commonly coupled to the common body pad 130. Drains of the test transistors TEA0–TEAn are electrically connected to the global drain pads (140__0)–(140__n), respectively.

Continuously referring to FIG. 4, a TEG module 200 includes a plurality of test elements TEB0–TEBn each corresponding to their test elements TEA0–TEAn of the TEG module 100, a common source pad 220, and a common body pad 230. The test elements, i.e., test transistors TEB0–TEBn of the TEG module 200 are formed in a pocket P-well region formed in an N+-well region. Sources of the test transistors TEB0–TEBn are commonly connected to a common source pad 220. Bodies of the test transistors TEB0–TEBn are commonly connected to a common body pad 230. Gates of the test transistors TEB0–TEBn are commonly connected to the global gate pad 110 together with the gates of the test transistors TEA0–TEAn. Drains of the test transistors TEB0–TEBn are electrically connected to the global drain pads (140_0)–(140_n), respectively. The other TEG modules have the same construction as the TEG module 200.

According to the test element group structure of this invention, each TEG module is independently formed in a pocket P-well region such that bodies of test transistors are divided in terms of the TEG module. In such a divided region, all test transistors commonly use one body pad and one source pad, and a body power and a ground voltage are applied to a common body and source pads, respectively. For example, in a case where electric properties of the test transistor TEA0 in the TEG module 100 are measured, a gate voltage is applied to the global gate pad 110, a drain voltage is applied to the global drain pad 140_0, and a body voltage is applied to the common body pad 130. A drain voltage having the same level as the drain voltage applied to the global drain pad 140_0 is applied to the common body pads 230–330 and the common source pads 210–310 in the TEG modules 200–300, which is for preventing a leakage current from flowing through test transistors TEB0–TEC0 commonly connected to the global drain pad 140_0.

Figure 5:
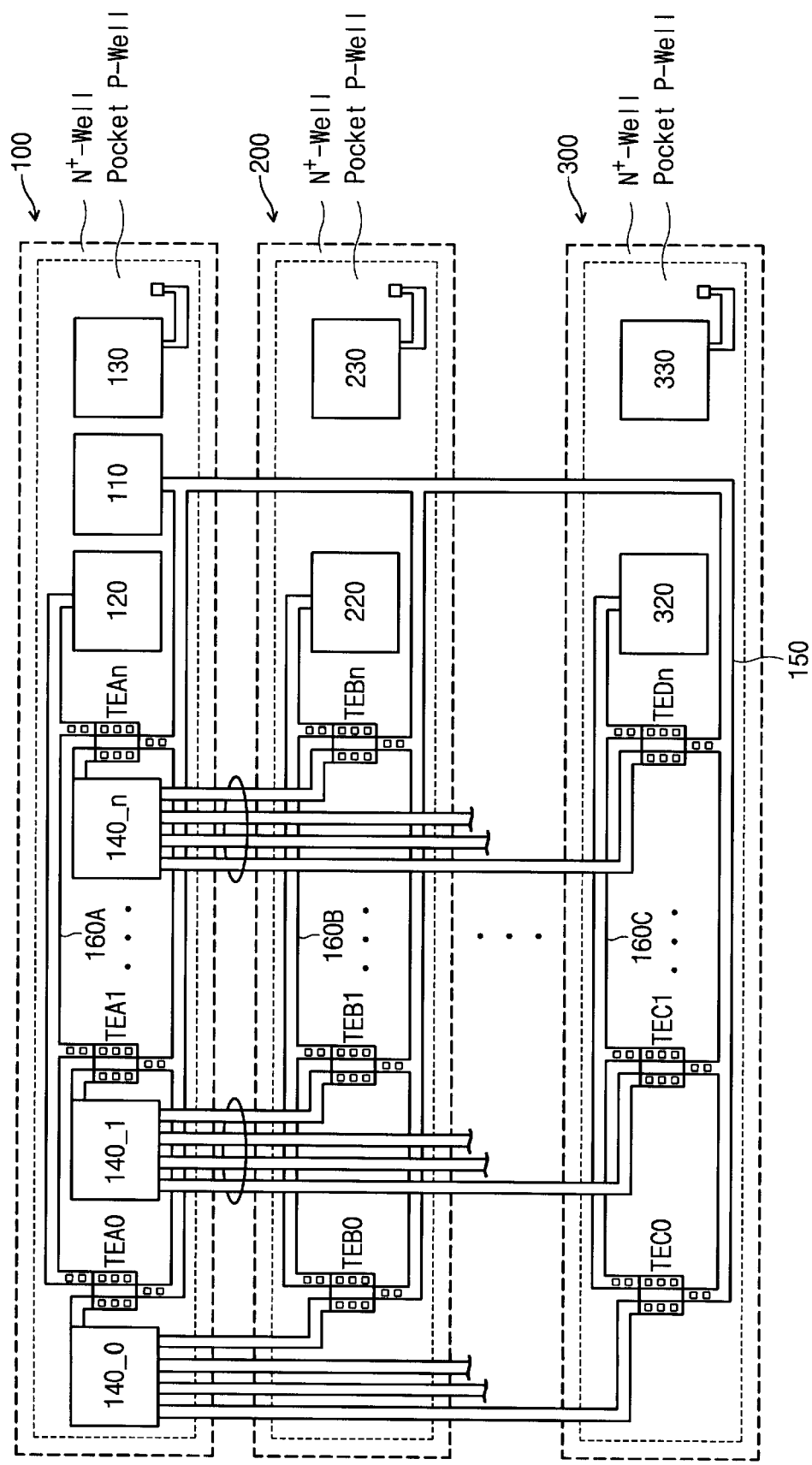
FIG. 5 is a top plan view of a layout structure of TEG modules shown in FIG. 4.
Figure 6:
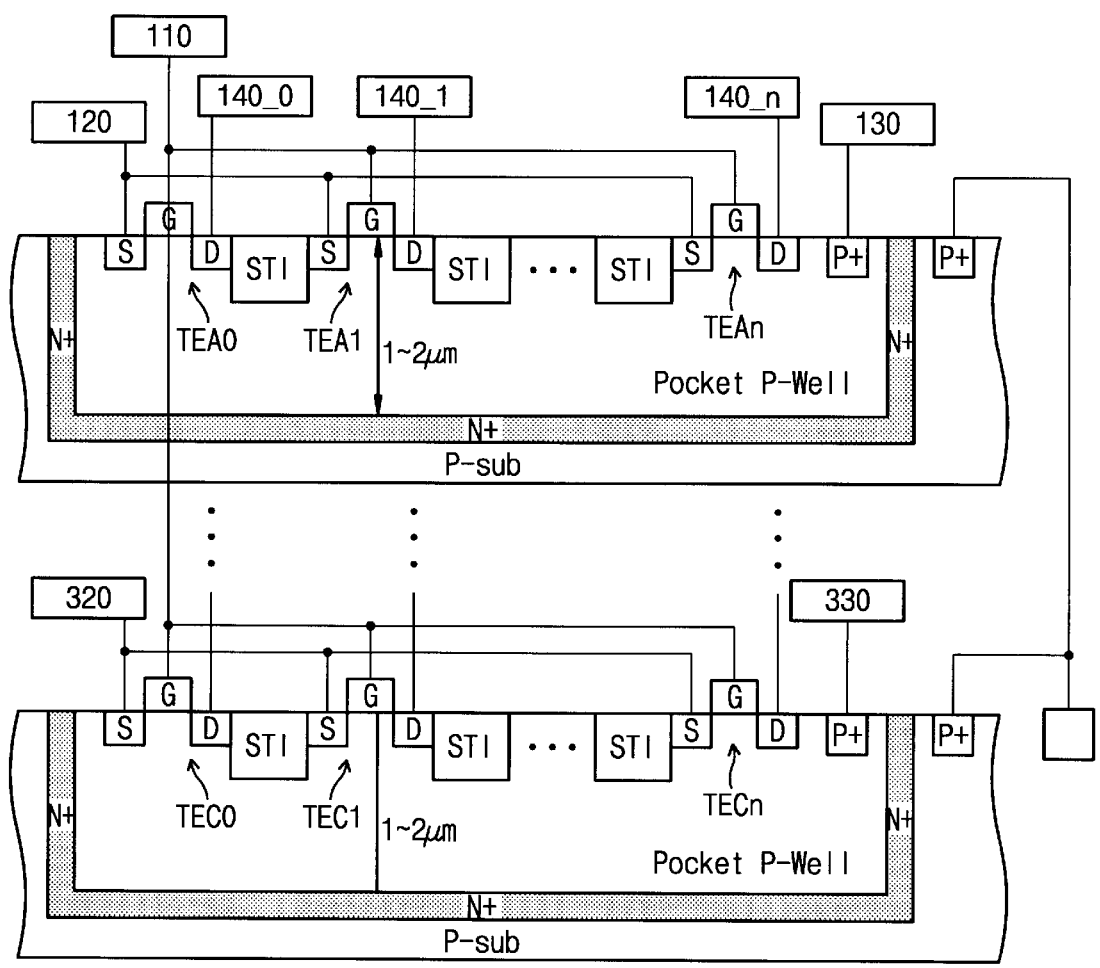
FIG. 6 is a cross-sectional view of a sectional structure of the TEG modules shown in FIG. 4.

FIG. 5 is a top plan view of a layout structure of the TEG modules shown in FIG. 4, and FIG. 6 is a cross-sectional view of a sectional structure of the TEG modules shown in FIG. 4.

Referring to FIG. 5, a plurality of global drain pads (140_0)–(140_n) are disposed in a pocket P-well region of the TEG module 100. Test transistors TEA0–TEAn, TEB0–TEBn, and TEC0–TECn are formed in N+-well regions corresponding to the TEG modules 100–300. Drains of the test transistors TEA0, TEB0, . . . , and TEC0 in the TEG modules 100, 200, . . . , and 300 are commonly connected to a global drain pad 140_0. Drains of the test transistors TEA1, TEB1, . . . , and TEC1 in the TEG modules 100, 200, . . . , and 300 are commonly connected to a global drain pad 140_1. Similarly, the other test transistors are connected by the same manner as described above.

A global gate pad 110 is disposed in the pocket P-well region of the TEG module 100. Gates of the test transistors in the TEG modules 100, 200, . . . , and 300 are commonly connected to the global gate pad 110 through a common gate line 150. Common source pads 120, 220, . . . , and 320 and common body pads 130, 230, . . . , and 330 are disposed in the pocket P-well regions of the TEG modules 100, 200, . . . , and 300, respectively. Sources of the test transistors TEA0–TEAn in the TEG modules are commonly connected to the common source pad 120 through a common source line 160A. Sources of the test transistors TEB0–TEBn in the TEG module 200 are commonly connected to the common source pad 220 through a common source line 160B. Similarly, sources of respective test transistors in the other TEG modules are connected by the same manner as the TEG modules 100 and 200. The P-well regions 100, 200, . . . , and 300 separately receive a body voltage through corresponding common body pads 130, 230, . . . , and 330, respectively.

The test transistors TEA0–TEAn formed in the pocket P-well region of the TEG module 100 are electrically isolated from one another by a shallow trench isolator (STI), as shown in FIG. 6. Similarly, test transistors formed in respective pocket P-well regions of the other TEG modules 200–300 are disposed by the same manner as described above. Each of the pocket P-well regions is electrically connected to a common body pad through a P+-doping area, and is formed in an N+-well region that is formed in a P-type semiconductor substrate. In addition, each of the pocket P-well regions has a depth of about 1–2 micrometers.

As described so far, drain pads coupled to drains of test transistors constituting one TEG module are shared with the other TEG modules to considerably reduce an area occupied by the TEG module. A resulting advantage is that the area of the wafer occupied by the drain pads according to embodiments of the invention is much less of a limiting factor to the number of test transistors that can be provided in a TEG module, in contrast to the Background Art, because the architectures according to the embodiments of the invention do not require a 1:1 ratio between the drain pad and the test element. Therefore any need to decrease the number of test elements included in the TEG module (caused by the width of a scribe line area being reduced) is lessened as contrasted with the Background Art.

While the invention has been shown and described with reference to a certain preferred embodiment thereof, it will be understood that various changes in form and details may be made without departing from the spirit and scope of the invention. For example, the invention realizes a test element group structure using a triple-well technique, but it is apparent to a person of ordinary skill in the art that the test element group structure may be realized using a twin-well technique. Additionally, except a pocket P-well region in which the global drain pads (140_0)–(140_n) are disposed, a global gate pad 110 may be disposed in another pocket P-well region.

What is claimed is:

1. A semiconductor wafer comprising:
a plurality of chip areas having circuit elements;
a scribe line area for defining the chip areas; a test element group that is formed on the scribe line area and includes a plurality of test element group (TEG) modules,
each of the TEG modules including test transistors formed using substantially the same manner as the circuit elements, each test transistor having a source, a drain, a gate and a body, each TEG module further including a first pad commonly connected to sources of the test transistors, and a second pad commonly connected to bodies of the test transistors;
a third pad commonly connected to gates of test transistors in the TEG modules; and
a plurality of fourth pads, each fourth pad being commonly connected to a drain of a respective test transistor in at least two TEG modules.

2. The semiconductor wafer as defined in claim 1, wherein the third pad is disposed in one of the TEG modules.

3. The semiconductor wafer as defined in claim 1, wherein the fourth pads are disposed in one of the TEG modules.

4. The semiconductor wafer as defined in claim 1, wherein each of the TEG modules is formed in a pocket P-well region that is formed using a triple-well technique.

5. The semiconductor wafer as defined in claim 1, wherein when corresponding test voltages are respectively applied to the first to fourth pads coupled to a test transistor in one selected from the TEG modules, substantially the same test voltage applied to the fourth pad is substantially simultaneously also applied to first and second pads of each of unselected TEG modules.

6. The semiconductor wafer as defined in claim 1, wherein each of the TEG modules is formed in a pocket P-well region that is formed using a twin-well technique.

7. A test element group disposed in a scribe line area defined by chip areas formed on a semiconductor wafer, the test element group comprising:
   at least two test element group (TEG) modules each being formed in a pocket well region,
   wherein each of the TEG modules includes:
      test transistors each having a source, a drain, a gate, and a body and being formed by substantially the same manner as the chip areas;
      a common source pad commonly connected to sources of the test transistors; and
      a common body pad commonly connected to bodies of the test transistors;
   a global gate pad that is commonly connected to gates of the test transistors in the TEG modules; and
   a plurality of global drain pads, each drain pad being connected to a drain of a respective test transistor in the first TEG module and a drain of a respective test transistor in the second TEG module.

8. The test element group as defined in claim 7, wherein when corresponding test voltages are respectively applied to the common source pad, the common body pad, the global gate pad, and one of the global drain pads in the first TEG module, substantially the same test voltage applied to said one of the common source drain pads is substantially simultaneously also applied to a common source pad and a common body pad in the second TEG module.

9. The test element group as defined in claim 7, wherein the pocket well region is a pocket P-well region.

10. A test element group supplied to a scribe line area so as to measure electric properties of circuit elements integrated in a chip area, the test element group comprising:
   first to third test element group (TEG) modules each being disposed in respective pocket P-well regions,
   the first TEG module including:
      first test transistors each having a source, a drain, a gate and a body and being formed in substantially the same manner as chip areas;
      a first common source pad commonly connected to sources of the first test transistors;
      a first common body pad commonly connected to bodies of the first test transistors;
      a global gate pad that is disposed in the first TEG module and is commonly connected to gates of the first test transistors; and
      a plurality of global drain pads that are disposed in the first TEG module and are connected to drains of the first test transistors respectively;
   the second TEG module including:
      second test transistors each having a source, a drain, a gate, and a body and being formed in substantially the same manner as transistors in the chip area, the second test transistors corresponding to the first test transistors, respectively;
      a second common source pad commonly connected to sources of the second transistors; and
      a second common body pad commonly connected to bodies of the second transistors,
      the drains of the second test transistors being connected to corresponding global drain pads, respectively, and the gates of the second test transistors being commonly connected to the global gate pad; and
   the third TEG module including:
      third test transistors each having a source, a drain, a gate, and a body and being formed in substantially the same manner as transistors in the chip area, wherein the third test transistors correspond to the first test transistors, respectively;
      a third common source pad commonly connected to sources of the third test transistors; and
      a third common body pad commonly connected to bodies of the third test transistors,
      the drains of the third transistors being connected to corresponding global drain pads, respectively, and the gates of the third transistors being commonly connected to the global gate pad.

11. The test group element as defined in claim 10, wherein when corresponding test voltages are respectively applied to the first common source pad, the first common body pad, the global gate pad, and one of the global drain pads in the first TEG module, substantially the same test voltage applied to said one of the global drain pads is substantially simultaneously also applied to second and third common source pads and second and third common body pads in the second and third TEG modules.

12. The test element group as defined in claim 7, wherein the global gate pad is disposed in one of the TEG modules and each of the drain pads is disposed in one of the TEG modules.

13. The test element group as defined in claim 12, wherein the global gad pad is disposed in the same TEG module as the drain pads.

14. A method used during the production of a semiconductor wafer, such a wafer having
   a scribe line area that defines a plurality of chip areas, each chip area having a plurality of circuit elements, and
   a test element group formed on the scribe line area, the test element group including
      (1) a plurality of test element group (TEG) modules, each TEG module including
         (a) a plurality of test transistors formed in substantially the same manner as the circuit elements, each test transistor including a source, a drain, a gate, and a body,
         (b) a first pad commonly connected to sources of the test transistors, and
         (c) a second pad commonly connected to bodies of the test transistors,
      (2) a third pad commonly connecting gates of test transistors in the TEG modules, and
      (3) a plurality of fourth pads, each fourth pad being commonly connected to a drain of corresponding test transistors in at least two TEG modules, respectively,
   the method comprising:
      providing respective test signals for a first TEG module to the common source pad and the common body pad of the first TEG module, the global gate pad and one of said global data pads; and
      substantially simultaneously providing substantially the same signals used for said one of said global data pads to the common source pad and the common body pad in at least a second TEG module.

15. The semiconductor wafer as defined in claim 1, wherein each fourth pad is commonly connected to a drain of a respective test transistor in at least three TEG modules.

16. The test element group as defined in claim 7, wherein:
   at least three TEG modules are included in the test element group; and
   each drain pad is connected to a drain of a respective test transistor in the at least three TEG modules.

* * * * *